(12) United States Patent
Fukumoto et al.

(10) Patent No.: US 10,181,445 B2
(45) Date of Patent: Jan. 15, 2019

(54) POWER MODULE

(71) Applicant: Mitsubishi Electric Corporation, Chiyoda-ku (JP)

(72) Inventors: Akihisa Fukumoto, Chiyoda-ku (JP); Tetsu Negishi, Chiyoda-ku (JP); Kei Yamamoto, Chiyoda-ku (JP); Toshiaki Shinohara, Chiyoda-ku (JP); Kazuyasu Nishikawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/537,466

(22) PCT Filed: Sep. 29, 2015

(86) PCT No.: PCT/JP2015/077470
§ 371 (c)(1),
(2) Date: Jun. 19, 2017

(87) PCT Pub. No.: WO2016/108261
PCT Pub. Date: Jul. 7, 2016

(65) Prior Publication Data
US 2017/0352629 A1 Dec. 7, 2017

(30) Foreign Application Priority Data

Dec. 29, 2014 (JP) ................................. 2014-266966

(51) Int. Cl.
*H01L 23/00* (2006.01)
*H01L 23/48* (2006.01)
(Continued)

(52) U.S. Cl.
CPC .......... *H01L 23/562* (2013.01); *H01L 23/051* (2013.01); *H01L 23/293* (2013.01);
(Continued)

(58) Field of Classification Search
CPC ......... H01L 23/562; H01L 2224/29565; H01L 2224/40155; H01L 2924/351;
(Continued)

(56) References Cited

U.S. PATENT DOCUMENTS 3,914,858 A * 10/1975 Sonoda ................. H01L 23/057
156/153
4,402,004 A * 8/1983 Iwasaki ................. H01L 23/051
257/623
(Continued)

FOREIGN PATENT DOCUMENTS

JP 2006-179538 A 7/2006
JP 2006-179655 A 7/2006
(Continued)

OTHER PUBLICATIONS

International Search Report dated Dec. 8, 2015 in PCT/JP2015/077470 filed Sep. 29, 2015.

*Primary Examiner* — Victoria K Hall
(74) *Attorney, Agent, or Firm* — Oblon, McClelland, Maier & Neustadt, L.L.P.

(57) ABSTRACT

A power module includes a power semiconductor element, an interconnection material, a circuit board, an external terminal, a joining material, and a sealing resin. A clearance portion is continuously formed between the sealing resin and each of an end surface of the joining material and a surface of the interconnection material so as to extend from the end surface of the joining material to the surface of the interconnection material, the end surface of the joining material being located between the power semiconductor element and the interconnection material, the surface of the interconnection material being located between the end surface and a predetermined position of the interconnection material separated by a distance from the end surface.

17 Claims, 10 Drawing Sheets

(51) Int. Cl.
*H01L 23/051* (2006.01)
*H01L 23/29* (2006.01)
*H01L 23/31* (2006.01)
*H01L 23/373* (2006.01)
*H01L 25/07* (2006.01)

(52) U.S. Cl.
CPC ...... *H01L 23/3114* (2013.01); *H01L 23/3735* (2013.01); *H01L 23/48* (2013.01); *H01L 24/29* (2013.01); *H01L 24/32* (2013.01); *H01L 24/37* (2013.01); *H01L 24/40* (2013.01); *H01L 24/73* (2013.01); *H01L 23/3107* (2013.01); *H01L 25/072* (2013.01); *H01L 2224/29111* (2013.01); *H01L 2224/29139* (2013.01); *H01L 2224/29147* (2013.01); *H01L 2224/29565* (2013.01); *H01L 2224/29655* (2013.01); *H01L 2224/32225* (2013.01); *H01L 2224/32245* (2013.01); *H01L 2224/33181* (2013.01); *H01L 2224/3754* (2013.01); *H01L 2224/40095* (2013.01); *H01L 2224/40137* (2013.01); *H01L 2224/40155* (2013.01); *H01L 2224/73213* (2013.01); *H01L 2224/73263* (2013.01); *H01L 2224/84801* (2013.01); *H01L 2924/0002* (2013.01); *H01L 2924/00014* (2013.01); *H01L 2924/014* (2013.01); *H01L 2924/181* (2013.01); *H01L 2924/18301* (2013.01); *H01L 2924/351* (2013.01)

(58) Field of Classification Search
CPC ............... H01L 23/293; H01L 23/3114; H01L 23/3735; H01L 24/29; H01L 24/32; H01L 24/37; H01L 24/73; H01L 2224/29111; H01L 2224/29139; H01L 2224/29147; H01L 2224/29655; H01L 2224/32225; H01L 2224/73213; H01L 2924/014; H01L 23/3192; H01L 23/3157; H01L 23/3135; H01L 23/315; H01L 23/49579; H01L 23/49586
USPC ......................................................... 257/669
See application file for complete search history.

(56) References Cited

U.S. PATENT DOCUMENTS

| | | | | |
|---|---|---|---|---|
| 4,996,586 A * | 2/1991 | Matsuda | ............... | H01L 23/051 257/633 |
| 5,311,399 A * | 5/1994 | Zell | ............... | H01L 23/15 257/669 |
| 5,536,972 A * | 7/1996 | Kato | ............... | H01L 23/3121 257/706 |
| 5,883,439 A * | 3/1999 | Saitoh | ............... | H01L 23/3135 257/787 |
| 6,215,185 B1 * | 4/2001 | Kikuchi | ............... | H01L 23/49579 257/747 |
| 6,307,755 B1 * | 10/2001 | Williams | ............... | H01L 23/4334 174/260 |
| 6,703,707 B1 * | 3/2004 | Mamitsu | ............... | H01L 23/051 257/718 |
| 6,852,567 B1 * | 2/2005 | Lee | ............... | H01L 23/3142 438/106 |
| 9,653,390 B2 * | 5/2017 | Nakata | ............... | H01L 24/03 |
| 2006/0289974 A1 * | 12/2006 | Saran | ............... | H01L 23/3142 257/669 |
| 2008/0203564 A1 * | 8/2008 | Motoyoshi | ............... | H01L 21/563 257/737 |
| 2008/0258316 A1 * | 10/2008 | Tamba | ............... | H01L 23/295 257/784 |
| 2008/0296774 A1 * | 12/2008 | Kellner-Werdehausen | ............... | H01L 23/051 257/773 |
| 2008/0308924 A1 | 12/2008 | Szewerenko et al. | | |
| 2011/0012251 A1 * | 1/2011 | Teramae | ............... | H01L 23/24 257/693 |
| 2011/0309375 A1 * | 12/2011 | Kato | ............... | H01L 21/565 257/77 |
| 2012/0043662 A1 * | 2/2012 | Ohno | ............... | H01L 23/3185 257/773 |
| 2012/0286405 A1 | 11/2012 | Toyota | | |
| 2013/0009298 A1 * | 1/2013 | Ota | ............... | H01L 23/24 257/676 |
| 2013/0126913 A1 * | 5/2013 | Hwu | ............... | H01L 25/0753 257/88 |
| 2013/0270688 A1 * | 10/2013 | Ota | ............... | H01L 23/36 257/690 |
| 2014/0131845 A1 | 5/2014 | Imai et al. | | |
| 2015/0287653 A1 * | 10/2015 | Pelley | ............... | H01L 22/22 257/777 |
| 2016/0204046 A1 * | 7/2016 | Iwashige | ............... | H01L 23/293 257/669 |
| 2016/0233202 A1 * | 8/2016 | Komo | ............... | H01L 23/00 |
| 2017/0033028 A1 * | 2/2017 | Negishi | ............... | H01L 21/02164 |
| 2017/0278771 A1 * | 9/2017 | Kanai | ............... | H01L 21/4803 |
| 2017/0309544 A1 * | 10/2017 | Kobayashi | ............... | H01L 23/473 |

FOREIGN PATENT DOCUMENTS

| | | |
|---|---|---|
| JP | 2010-232365 A | 10/2010 |
| JP | 2012-238796 A | 12/2012 |
| JP | 2014-99487 A | 5/2014 |

* cited by examiner

POWER MODULE

TECHNICAL FIELD

The present invention relates to a power module, particularly, a power module in which a power semiconductor element is sealed with a resin.

BACKGROUND ART

A power module for controlling power includes a power semiconductor element such as a diode, an insulated gate bipolar transistor (IGBT), or a metal oxide semiconductor field effect transistor (MOSFET).

In each of these power semiconductor elements, respective electrodes are formed on two surfaces thereof facing each other. A circuit board or interconnection material is electrically connected to each of the electrodes and the power semiconductor element is insulatively sealed with a sealing resin, thus manufacturing the power module.

The power semiconductor element is electrically connected to the circuit board by joining the power semiconductor element onto the circuit board with a joining material, such as a solder, being interposed therebetween, for example. Moreover, for example, in the case of a power module for large current, the power semiconductor element is electrically connected to the interconnection material by joining a plate-like interconnection material onto each of the electrodes of the power semiconductor element with the joining material, such as a solder, being interposed therebetween.

The plate-like interconnection material has a linear expansion coefficient greatly different from that of the power semiconductor element. For example, copper, which is frequently used as such a plate-like interconnection material, has a linear expansion coefficient of about 17 ppm/° C. (17 μm/° C./m). On the other hand, silicon, which is frequently used as such a power semiconductor element, has a linear expansion coefficient of about 3 ppm/° C. (3 μm/° C./m). When a temperature (environmental temperature) around the semiconductor module or a temperature of the power semiconductor element itself is fluctuated, the difference in linear expansion coefficient therebetween leads to application of thermal stress to the joining material for connecting the plate-like interconnection material to the power semiconductor element. Repeated application of thermal stress to the joining material causes a generation of a crack in the joining material, thus resulting in a deteriorated function of the power module, disadvantageously.

In order to overcome such a problem, the following method is employed: a curable sealing resin is used as an insulation sealing for the power module to mechanically bind the power semiconductor element, the joining material, and the plate-like interconnection material, thereby reinforcing the joining material. The insulation sealing by the sealing resin is performed by: surrounding, with an uncured insulation resin, the power semiconductor element connected to the circuit board, the interconnection material, and the like; and curing the resin in that state.

As one example thereof, there is the following method: a power semiconductor element connected to a circuit board, an interconnection material, and the like is set in a metal mold, then an uncured sealing resin is poured into the metal mold, and the sealing resin is cured under application of pressure. As another example, there is the following method: a circuit board to which a power semiconductor element is joined is joined to a base plate; a case having a shape surrounding the circumference of the power semiconductor element is adhered onto the base plate; and then an uncured sealing resin is poured into the case and is cured.

However, generally, since the linear expansion coefficient of the sealing resin is larger than the linear expansion coefficient of the power semiconductor element, shear stress is generated at an interface between the sealing resin and the power semiconductor element when an environmental temperature or temperature of the power semiconductor element itself is fluctuated. When adhesion force of the sealing resin to the power semiconductor element is weak, the sealing resin may be detached from the power semiconductor element, thus resulting in a decreased insulating property between the electrodes of the power semiconductor element, disadvantageously.

For example, as a method for preventing such detachment of the sealing resin from the power semiconductor element, each of Patent Document 1 and Patent Document 2 proposes the following method: a polyimide film having strong adhesion force to a sealing resin is formed on a power semiconductor element connected to a circuit board, an interconnection material, and the like, and they are sealed with a sealing resin from above the polyimide film.

Furthermore, Patent Document 2 proposes a method for detaching the sealing resin from a portion of the surface of the interconnection material at a position distant from each of the power semiconductor element and the joining material. In this method, the sealing resin at the position distant away from the joining material is detached to relax stress, thereby suppressing detachment of the sealing resin from the surface of the joining material and the surface of the power semiconductor element.

CITATION LIST

Patent Document

PTD 1: Japanese Patent Laying-Open No. 2006-179538
PTD 2: Japanese Patent Laying-Open No. 2006-179655

SUMMARY OF INVENTION

Technical Problem

Still in the case of the conventional power module, the sealing with the resin needs to be performed after forming a certain film such as the polyimide film on the power semiconductor element connected to the circuit board, the interconnection material, and the like. However, since the power semiconductor element connected to the circuit board, the interconnection material, and the like has a complicated shape, it is difficult to form a uniform film. Therefore, a relatively complicated process is required.

The present invention has been made to solve the foregoing problem, and has an object to provide a power module that can prevent the sealing resin from being detached from a power semiconductor element or the like, in a simple manner.

Solution to Problem

A power module according to the present invention includes a power semiconductor element, an interconnection material, a joining material, a circuit board, and a sealing resin. The power semiconductor element has a first surface and a second surface facing each other, a first electrode is formed on the first surface, and a second electrode is formed on the second surface. The interconnection material is disposed to face the first surface of the power semiconductor element. The joining material is formed between the first electrode and the interconnection material to electrically and mechanically connect the first electrode to the interconnection material. The circuit board is disposed to face the second surface of the power semiconductor element and is electrically and mechanically connected to the second electrode. The sealing resin seals the power semiconductor element, the interconnection material, the joining material, and the circuit board. A clearance portion is provided between the sealing resin and each of an end surface of the joining material and a surface of the interconnection material so as to extend from the end surface of the joining material to the surface of the interconnection material, the end surface of the joining material being located between the power semiconductor element and the interconnection material, the surface of the interconnection material being located between the end surface and a position of the interconnection material separated by a distance from the end surface.

Advantageous Effects of Invention

According to the power module according to the present invention, the clearance portion is formed between the sealing resin and each of the end surface of the joining material and the surface of the interconnection material so as to extend from the end surface of the joining material to the surface of the interconnection material, the end surface of the joining material being located between the power semiconductor element and the interconnection material, the surface of the interconnection material being located between the end surface and the position of the interconnection material separated by a distance from the end surface. Accordingly, stress is relaxed at the interface between the power semiconductor element and the sealing resin, with the result that the sealing resin is less likely to be detached from the power semiconductor element. Accordingly, detachment of the sealing resin can be suppressed from being developed.

DESCRIPTION OF EMBODIMENTS

First Embodiment

Here, the following describes a power module in which a plate-like interconnection material is applied as an interconnection material electrically connected to a power semiconductor element.

Figure 1:
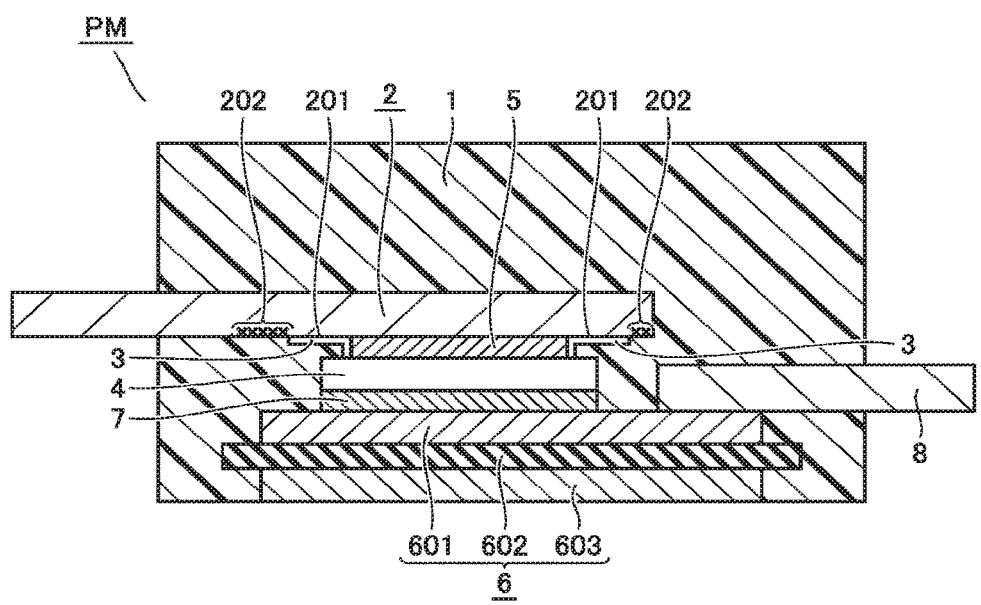
FIG. 1 is a cross sectional view of a power module according to a first embodiment of the present invention.

As shown in FIG. 1, a power module PM includes a power semiconductor element 4, an interconnection material 2, a circuit board 6, an external terminal 8, joining materials 5, 7, and a sealing resin 1. Power semiconductor element 4 has two surfaces facing each other, and respective electrodes (not shown) are formed on one surface and the other surface of power semiconductor element 4. Interconnection material 2 is in the form of a flat plate. Circuit board 6 includes: an insulating substrate 602 having two surfaces facing each other; and metal plates 601, 603. Metal plate 601 is disposed on one surface of insulating substrate 602, and metal plate 603 is disposed on the other surface of insulating substrate 602.

Interconnection material 2 in the form of a flat plate is electrically and mechanically connected, through joining material 5, to the electrode formed on one surface of power semiconductor element 4. Metal plate 601 of circuit board 6 is electrically and mechanically connected, through joining material 7, to the electrode formed on the other surface of power semiconductor element 4. Moreover, external terminal 8 is electrically and mechanically connected to metal plate 601 through a joining material (not shown), an ultrasonic joining method, or the like.

Insulating substrate 602 is composed of: a ceramic such as aluminum oxide, aluminum nitride, or silicon nitride; or an insulator such as an epoxy resin, for example. Each of metal plates 601, 603 is composed of a conductor such as copper or aluminum. As each of joining materials 5, 7, a solder or the like is applied, for example.

Sealing resin 1 insulatively seals power semiconductor element 4, circuit board 6, joining materials 5, 7, and external terminal 8 such that respective portions (end portions) of interconnection material 2 and external terminal 8 project from sealing resin 1 and the surface of metal plate 603 of circuit board 6 is exposed. Sealing resin 1 is thermally curable, such as an epoxy resin. The respective portions of interconnection material 2 and external terminal 8 projecting from sealing resin 1 are used as input/output terminals for current and voltage. Moreover, the exposed surface (bottom surface) of metal plate 603 is used as a surface to be connected to a heat sink.

In this power module PM, clearance portions 3 are provided by detaching sealing resin 1 from interconnection material 2 and joining material 5. Each of clearance portions 3 is formed between sealing resin 1 and each of an end surface of joining material 5 and a surface of interconnection material 2 so as to extend from the end surface of joining material 5 to the surface of interconnection material 2, the end surface of joining material 5 being located between power semiconductor element 4 and interconnection material 2, the surface of interconnection material 2 being located between the end surface and a position of interconnection material 2 separated by a distance from the end surface. A small clearance is formed in clearance portion 3. It should be noted that in FIG. 1 and the like, for the ease of description, the clearance is illustrated in an exaggerated manner.

Here, in this specification, clearance portion 3 refers to a space formed between sealing resin 1 and the end surface of joining material 5, or refers to a space formed between sealing resin 1 and the surface of interconnection material 2. Clearance portion 3 is a region surrounded by sealing resin 1, joining material 5, interconnection material 2, and power semiconductor element 4. Moreover, the expression "clearance" is not intended to define whether the space is formed artificially or spontaneously.

In order to provide clearance portion 3, a material having relatively weak adhesion force to sealing resin 1 is selected as joining material 5, and a solder is applied thereto, for example. Moreover, interconnection material 2 has a partial surface 201 at which clearance portion 3 is to be located and which has been previously through a process for decreasing the adhesion force to the sealing resin.

This will be described more in detail as follows. Joining material 5 is selected such that the adhesion force between joining material 5 and sealing resin 1 becomes the weakest among the adhesion force between interconnection material 2 and sealing resin 1, the adhesion force between power semiconductor element 4 and sealing resin 1, the adhesion force between metal plate 601 and sealing resin 1, and the adhesion force between joining material 5 and sealing resin 1. Examples of such a joining material 5 include a lead-free solder including Sn. Specific examples thereof include a material such as a Sn—Cu alloy, a Sn—Ag alloy or a Sn—Ag—Cu alloy. Each of the above-described adhesion forces can be measured in advance by a pudding cup test or the like, for example. It should be noted that the pudding cup test refers to a method for performing a shearing strength test with a pudding-cup shaped resin being formed on a surface of an appropriate member.

Mounting steps of power module PM are performed in the following order: a step of joining power semiconductor element 4 to circuit board 6; a step of joining interconnection material 2 to power semiconductor element 4; and a step of performing insulation sealing with sealing resin 1. External terminal 8 may be joined to circuit board 6 in any time as long as external terminal 8 is joined to circuit board 6 before the insulation sealing. Here, during the insulation sealing with thermally curable sealing resin 1, the whole of power module PM is exposed to a temperature environment of about 100 to 200° C. in order to cure sealing resin 1. When the temperature is reduced to the room temperature after sealing resin 1 is cured, a thermal stress is caused at an interface between sealing resin 1 and the structure due to the difference in the linear thermal expansion coefficient therebetween.

On this occasion, since the material having relatively weak adhesion force to sealing resin 1 is selected as joining material 5, sealing resin 1 is preferentially detached from the interface between joining material 5 and sealing resin 1 due to the thermal stress when the temperature is reduced to the room temperature.

Partial surface 201 of interconnection material 2 at which clearance portion 3 is to be located is a position adjacent to joining material 5 or a position close to joining material 5. Moreover, surface 201 of interconnection material 2 is located at the surface thereof facing power semiconductor element 4. The area of surface 201 is smaller than the total area of the interface between surface A of interconnection material 2 and sealing resin 1.

Surface 201 of interconnection material 2 has been previously through the process for decreasing the adhesion force to sealing resin 1. Accordingly, when the temperature is reduced to the room temperature after curing sealing resin 1, sealing resin 1 is detached from surface 201 due to the thermal stress. Here, examples of the process for decreasing the adhesion force between surface 201 of interconnection material 2 and sealing resin 1 include: a method for applying nickel (Ni) plating to interconnection material 2; a method for adhering a lead-free solder to the surface of interconnection material 2; and a method for smoothing the surface of interconnection material 2. Each of the methods above may be performed in any time in the mounting steps as long as it is performed before the insulation sealing.

The Ni plating and the lead-free solder can be formed on the surface of interconnection material 2 through pattern plating or the like. Moreover, when the lead-free solder is used for joining material 5, an amount of supply of the lead-free solder is increased to wet surface 201, thereby forming the lead-free solder on the surface of interconnection material 2. The surface can be made smooth in accordance with any polishing method.

In addition to these, there is a method for applying a parting agent to the surface of interconnection material 2. In this method, the parting agent is applied to the surface of interconnection material 2, thereby decreasing the adhesion force between surface 201 of interconnection material 2 and sealing resin 1. This method is desirably performed in the mounting steps by, for example, joining interconnection material 2 to power semiconductor element 4 and then applying a droplet thereof via a tip of a needle before insulatively sealing with sealing resin 1.

By performing such a process, clearance portion 3 is continuously formed between sealing resin 1 and each of the end surface of joining material 5 and the surface of interconnection material 2 so as to extend from the end surface of joining material 5 to the surface of interconnection material 2, the end surface of joining material 5 being located between power semiconductor element 4 and interconnection material 2, the surface of interconnection material 2 being located between the end surface and a position of interconnection material 2 separated by a distance from the end surface.

In power module PM, clearance portion 3 is continuously formed between sealing resin 1 and each of the end surface of joining material 5 and the surface of interconnection material 2 so as to extend from the end surface of joining material 5 to the surface of interconnection material 2, the surface of interconnection material 2 being located between the end surface and a position of interconnection material 2 separated by a distance from the end surface. Accordingly, stress is relaxed at the interface between power semiconductor element 4 and sealing resin 1, with the result that sealing resin 1 is less likely to be detached from power semiconductor element 4. Accordingly, detachment of sealing resin 1 can be suppressed from being developed.

Particularly, since clearance portion 3 is provided to include the end surface of joining material 5 at a portion at which power semiconductor element 4 and interconnection material 2 are closest to each other, it is possible to effectively relax the stress resulting from the difference in linear expansion coefficient between power semiconductor element 4 and interconnection material 2, as compared with a case where clearance portion 3 is provided at a position distant away from the power semiconductor element and the joining material.

Furthermore, in order to effectively prevent development of detachment, a position to which detachment of sealing resin 1 is supposed to be developed is subjected to a process for increasing adhesion force between sealing resin 1 and interconnection material 2. As shown in FIG. 1, for example, a process for exhibiting an anchor effect with respect to sealing resin 1 may be applied to a surface 202, which is at another position separated by a further distance relative to the predetermined position of interconnection material 2 separated by the distance from the end surface of joining material 5.

Surface 202 of interconnection material 2 is a position adjacent to surface 201 or a position close to surface 201. Moreover, surface 202 of interconnection material 2 is located at the surface (surface A) thereof facing power semiconductor element 4. The area of surface 202 is smaller than the total area of the interface between surface A of interconnection material 2 and the sealing resin. Examples of the process for exhibiting the anchor effect include a method for providing a rough surface of interconnection material 2. Alternative examples of the process include a method for forming a hole or through hole in interconnection material 2.

Next, the following describes modifications of power module PM. It should be noted that in each of the modifications, the same reference characters are given to the same members as those in the configuration of power module PM shown in FIG. 1, and are not repeatedly described unless required.

(First Modification)

Figure 2:
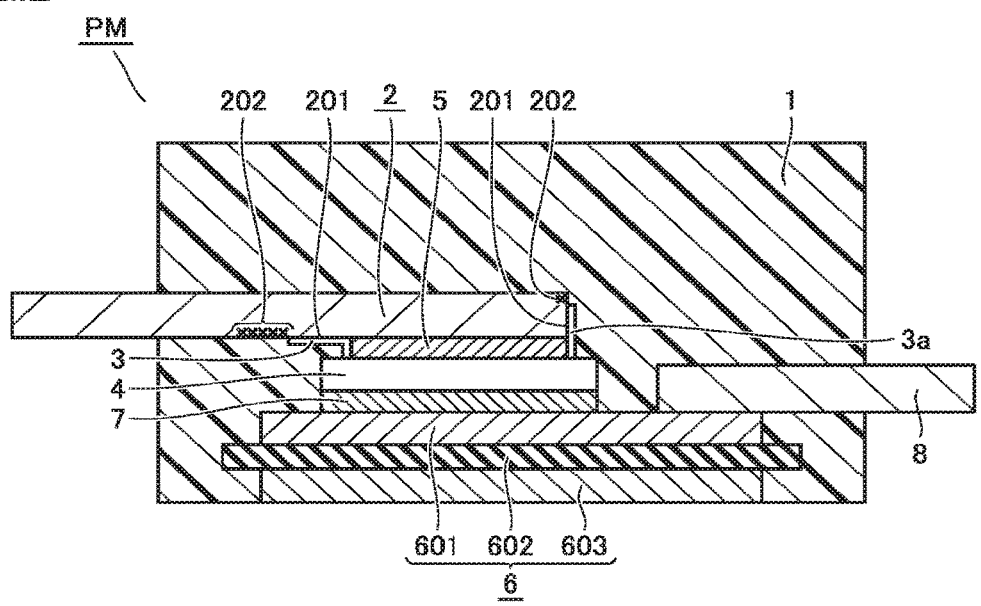
FIG. 2 is a cross sectional view of a power module according to a first modification in the embodiment.

Here, the following describes a modification of the manner of connection of interconnection material 2 to power semiconductor element 4. As shown in FIG. 2, interconnection material 2 is connected to power semiconductor element 4 with the end portion of interconnection material 2 being connected to joining material 5. The end surface of interconnection material 2 is substantially flush with the end surface of joining material 5.

As the clearance portion, in addition to clearance portion 3, a clearance portion 3a in which sealing resin 1 is continuously detached is formed to extend from the end surface of joining material 5 to a portion of the end surface of interconnection material 2. Moreover, a portion (surface 202) of the end surface of interconnection material 2 near clearance portion 3a has been through a process for increasing adhesion force between sealing resin 1 and interconnection material 2. It should be noted that in order to provide clearance portion 3a at the end surface of interconnection material 2, an interconnection material having a thickness on the order of 0.1 mm to 1 mm (several mm) is applied, for example.

In power module PM according to the first modification, clearance portion 3a is formed to extend from the end surface of joining material 5 to the portion of the end surface of interconnection material 2. Also in the case where such a clearance portion 3a is formed, stress can be relaxed at the interface between power semiconductor element 4 and sealing resin 1 since sealing resin 1 has been detached from interconnection material 2 and the like. Accordingly, sealing resin 1 is less likely to be detached from power semiconductor element 4, thereby suppressing development of detachment of sealing resin 1.

(Second Modification)

Figure 3:
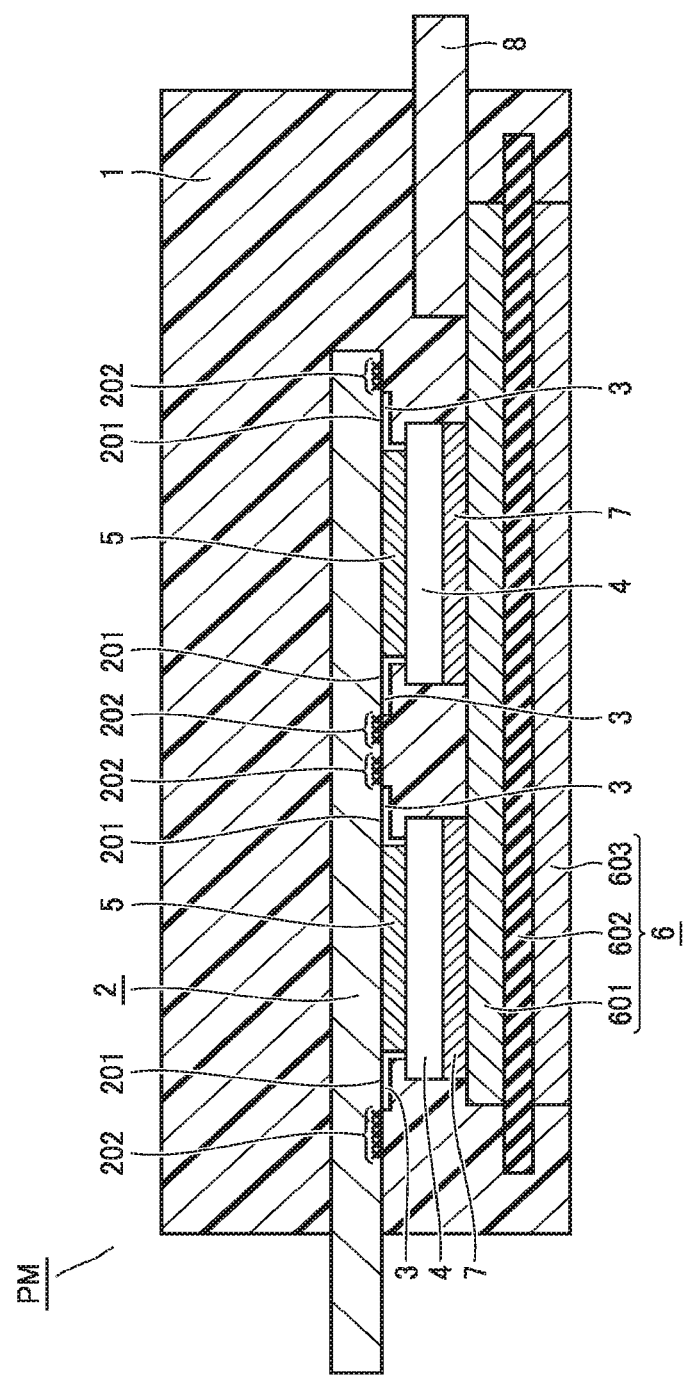
FIG. 3 is a cross sectional view of a power module according to a second modification in the embodiment.

Here, the following describes a power module including a plurality of power semiconductor elements. As shown in FIG. 3, power module PM includes two power semiconductor elements 4, for example. Interconnection material 2 is connected to bridge between two power semiconductor elements 4 by joining material 5.

Although power module PM according to the second modification includes two power semiconductor elements 4, clearance portion 3 is formed in each of two power semiconductor elements 4. Accordingly, stress can be relaxed at the interface between sealing resin 1 and each of power semiconductor elements 4. As a result, sealing resin 1 is less likely to be detached from power semiconductor element 4, thereby suppressing development of detachment of sealing resin 1.

Figure 4:
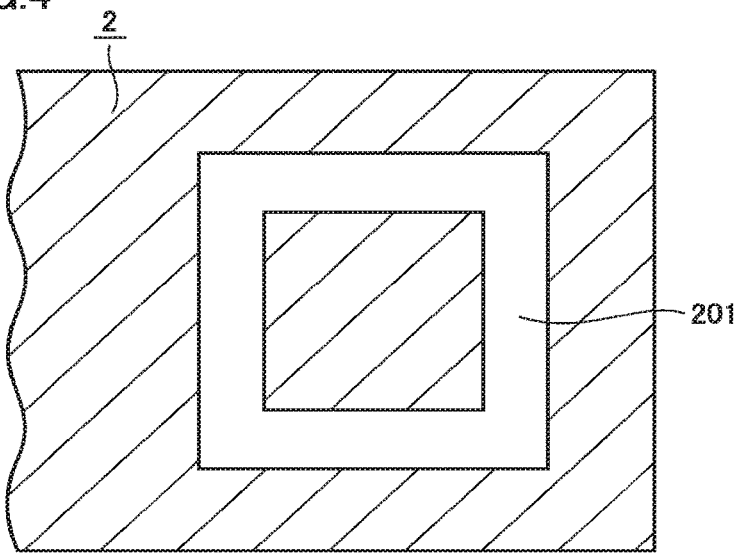
FIG. 4 is a partial plan view showing a surface, having decreased adhesion force, of an interconnection material in the embodiment.

As such, since clearance portion 3 is formed in each of power modules PM described above, stress can be relaxed. As described above, in clearance portion 3, surface 201 of interconnection material 2 has been through the process for decreasing the adhesion force to sealing resin 1. Here, FIG. 4 shows an exemplary pattern of surface 201 in interconnection material 2. As shown in FIG. 4, surface 201 is in the form of a frame having a width to surround a region (central rectangular portion) in which joining material 5 is located.

As described above, an exemplary process for decreasing adhesion force is a method for applying nickel (Ni) plating onto the region of interconnection material 2 corresponding to surface 201. Moreover, an alternative exemplary process for decreasing adhesion force is a method for applying a parting agent by stencil printing or the like to the region of interconnection material 2 corresponding to surface 201.

When the temperature is decreased to the room temperature after sealing resin 1 is cured, sealing resin 1 cannot withstand thermal stress resulting from the difference in linear thermal expansion coefficient at the interface between sealing resin 1 and surface 201 of interconnection material 2 having been through such a process, with the result that sealing resin 1 is detached from surface 201. Therefore, by changing the area to be subjected to the process for decreasing the adhesion force, clearance portion 3 can be designed.

This process can be performed before connecting interconnection material 2 and circuit board 6 to power semiconductor element 4. Hence, as compared with a case where the process is applied after finishing connecting the power semiconductor element to the circuit board and the interconnection material, the process can be applied to interconnection material 2 before connecting to the circuit board and the interconnection material, can be performed more simply, and is suitable for mass production.

Second Embodiment

Here, the following describes a first example of a power module to which an interconnection material having a plate-like portion and a projection is applied as an interconnection material electrically connected to the power semiconductor element.

Figure 5:
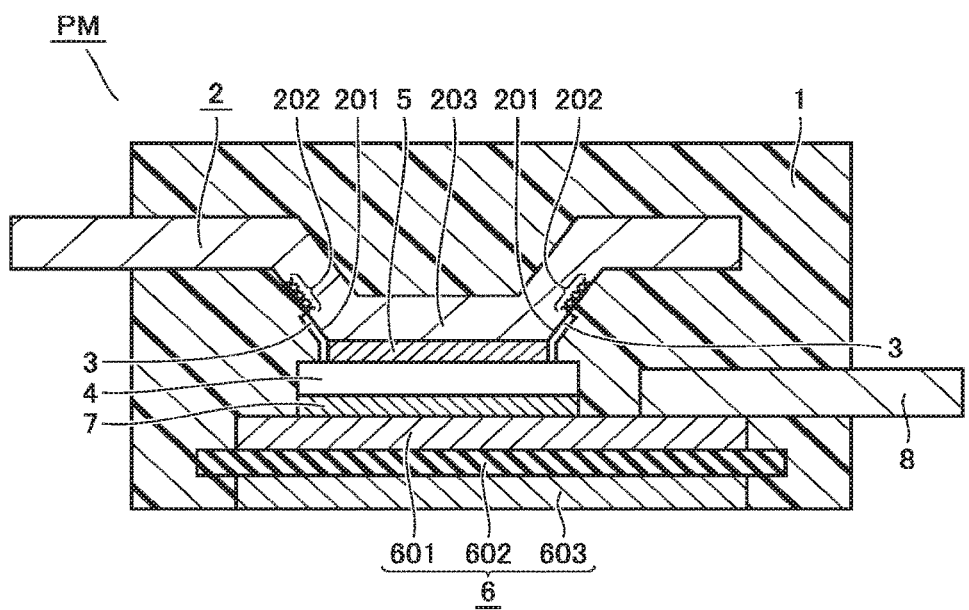
FIG. 5 is a cross sectional view of a power module according to a second embodiment of the present invention.

As shown in FIG. 5, in power module PM, interconnection material 2 has the plate-like portion and projection 203. Projection 203 of interconnection material 2 is electrically and mechanically connected, via joining material 5, to the electrode formed on one surface of power semiconductor element 4. It should be noted that since a configuration other than this is the same as that of power module PM shown in FIG. 1, the same reference characters are given to the same members and are not repeatedly described unless required.

Figure 6:
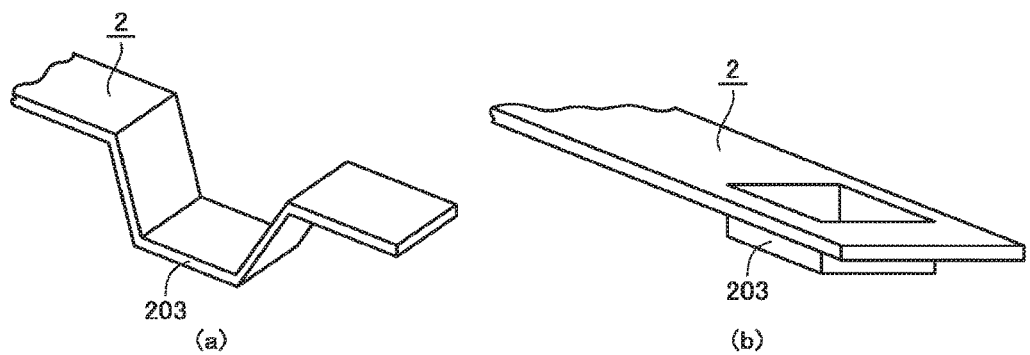
FIG. 6 (a) is a partial perspective view of an interconnection material according to one example in the power module in the embodiment, and FIG. 6 (b) is a partial perspective view of an interconnection material according to another example in the power module in the embodiment.

As interconnection material 2 having the plate-like portion and projection 203, for example, it is possible to apply an interconnection material 2 having a projection 203 formed by bending the plate-like portion as shown in FIG. 6 (a). Moreover, as shown in FIG. 6 (b), it is possible to apply an interconnection material 2 having a projection 203 formed by embossing the plate-like portion.

Also in power module PM described above, clearance portion 3 is formed between sealing resin 1 and each of the end surface of joining material 5 and the surface of interconnection material 2 so as to extend from the end surface of joining material 5 to the surface of interconnection material 2, the surface of interconnection material 2 being located between the end surface and a position of interconnection material 2 separated by a distance from the end surface. Accordingly, stress is relaxed at the interface between power semiconductor element 4 and sealing resin 1, with the result that sealing resin 1 is less likely to be detached from power semiconductor element 4. Accordingly, detachment of sealing resin 1 can be suppressed from being developed.

Moreover, a process for exhibiting an anchor effect with respect to sealing resin 1 is applied to surface 202, which is at another position separated by a further distance relative to the predetermined position of interconnection material 2 separated by the distance from the end surface of joining material 5. This effectively prevents development of detachment of sealing resin 1.

Next, the following describes a modification of power module PM described above. It should be noted that in each of the modifications, the same reference characters are given to the same members as those in the configuration of power module PM shown in FIG. 5 or FIG. 2, and are not repeatedly described unless required.

(First Modification)

Figure 7:
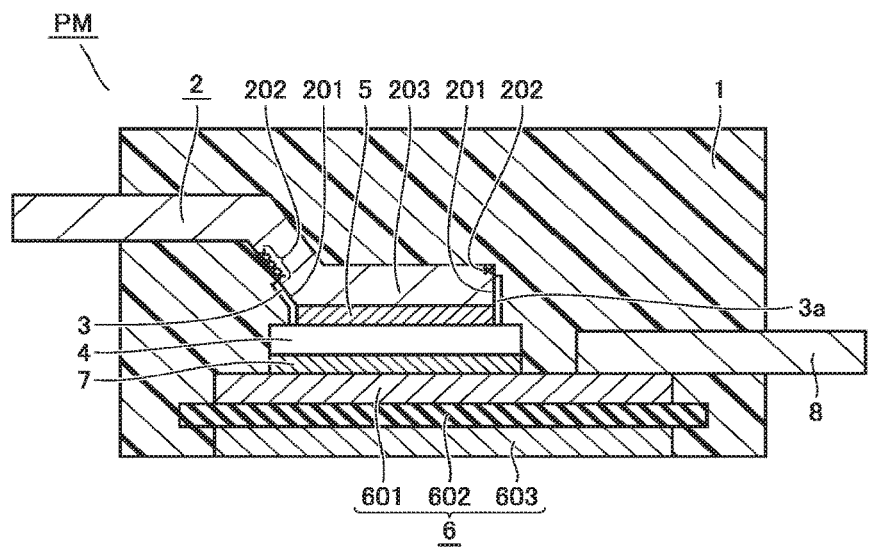
FIG. 7 is a cross sectional view of a power module according to a first modification in the embodiment.

As shown in FIG. 7, in a power module PM according to a first modification, as with the structure shown in FIG. 2 described above, interconnection material 2 is connected to power semiconductor element 4 such that the end portion of interconnection material 2 is connected to joining material 5.

Also in power module PM according to this first modification, clearance portion 3 is continuously formed between sealing resin 1 and each of the end surface of joining material 5 and the surface of interconnection material 2 so as to extend from the end surface of joining material 5 to the surface of interconnection material 2, the surface of interconnection material 2 being located between the end surface and a position of interconnection material 2 separated by a distance from the end surface. Accordingly, stress can be relaxed at the interface between power semiconductor element 4 and sealing resin 1, with the result that sealing resin 1 is less likely to be detached from power semiconductor element 4. Accordingly, detachment of sealing resin 1 can be suppressed from being developed.

(Second Modification)

Figure 8:
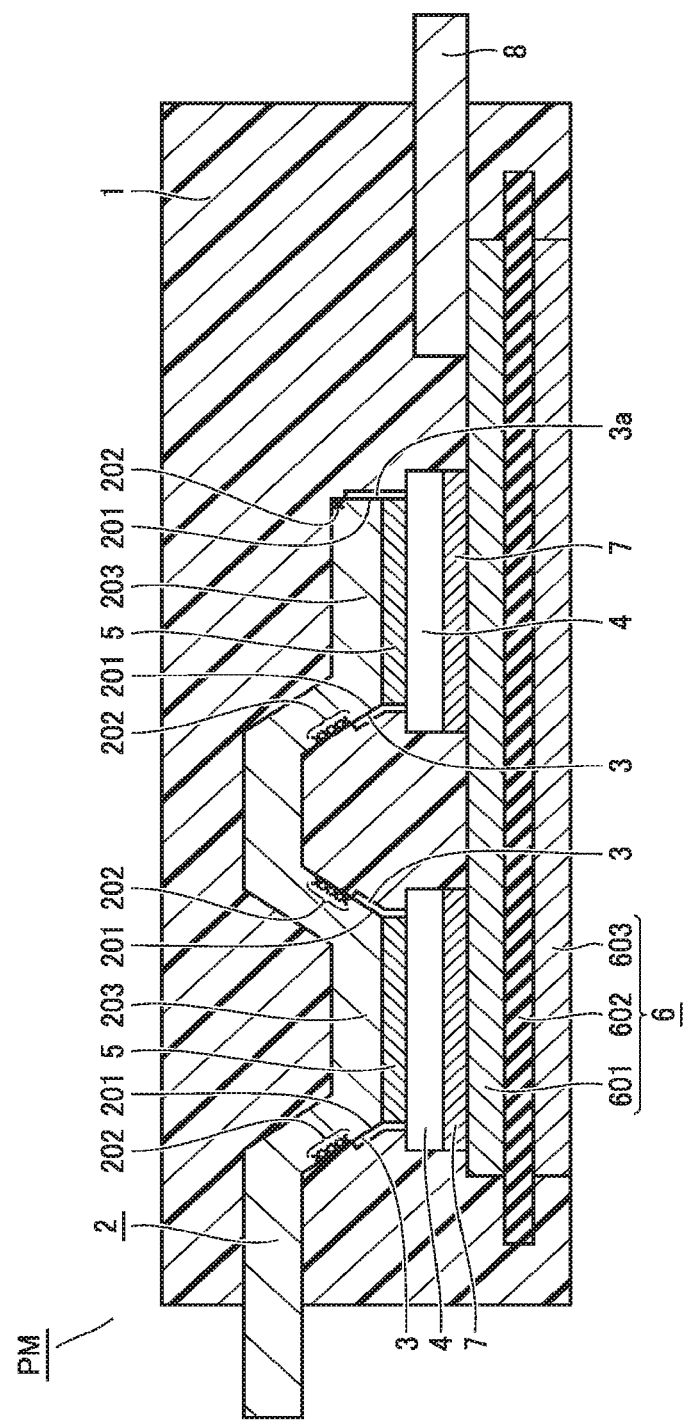
FIG. 8 is a cross sectional view of a power module according to a second modification in the embodiment.

As shown in FIG. 8, as with the structure shown in FIG. 3 described above, a power module PM according to a second modification includes two power semiconductor elements 4, and interconnection material 2 is connected to bridge between two power semiconductor elements 4 by joining material 5.

Also in power module PM according to the second modification, clearance portion 3 is formed in each of two power semiconductor elements 4. Accordingly, stress can be relaxed at the interface between sealing resin 1 and each of power semiconductor elements 4. As a result, sealing resin 1 is less likely to be detached from power semiconductor element 4, thereby suppressing development of detachment of sealing resin 1.

Third Embodiment

Here, the following describes a second example of the power module to which the interconnection material having the plate-like portion and the projection is applied as the interconnection material electrically connected to the power semiconductor element.

Figure 9:
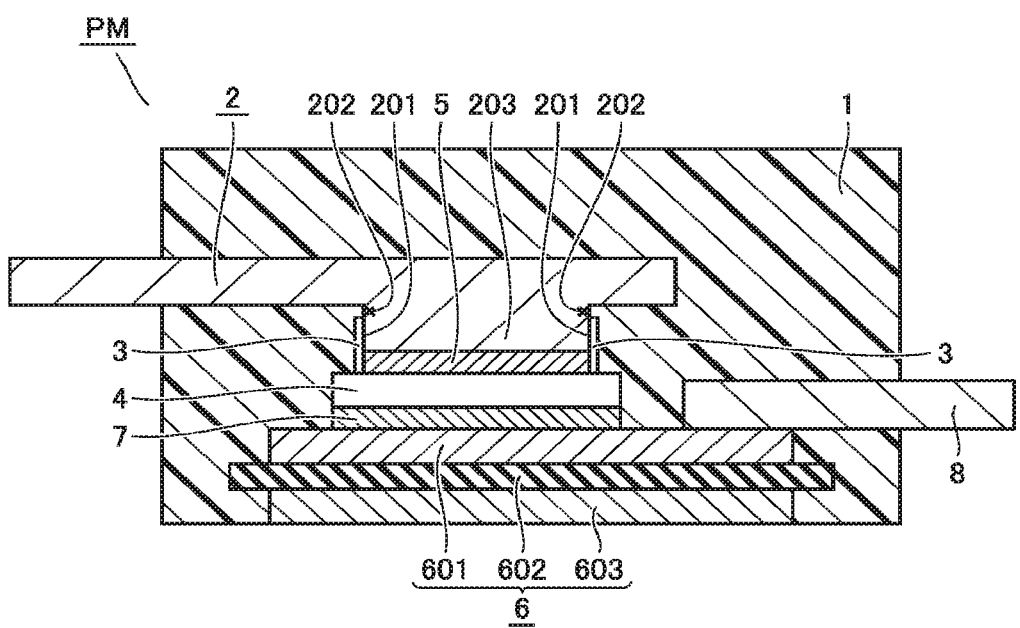
FIG. 9 is a cross sectional view of a power module according to a third embodiment of the present invention.

As shown in FIG. 9, in power module PM, interconnection material 2 has the plate-like portion and projection 203. Projection 203 of interconnection material 2 is electrically and mechanically connected, via joining material 5, to the electrode formed on one surface of power semiconductor element 4. Particularly, in this interconnection material 2, the plate-like portion and projection 203 are formed in one piece.

Interconnection material 2 is formed by casting or by applying a process such as grinding, for example. That is, projection 203 is solid. It should be noted that since a configuration other than this is the same as that of power module PM shown in FIG. 1, the same reference characters are given to the same members and are not repeatedly described unless required.

Also in power module PM described above, clearance portion 3 is continuously formed between sealing resin 1 and each of the end surface of joining material 5 and the surface of interconnection material 2 so as to extend from the end surface of joining material 5 to the surface of interconnection material 2, the surface of interconnection material 2 being located between the end surface and a predetermined position of projection 203 of interconnection material 2 separated by a distance from the end surface. Accordingly, stress is relaxed at the interface between power semiconductor element 4 and sealing resin 1, with the result that sealing resin 1 is less likely to be detached from power semiconductor element 4. Accordingly, detachment of sealing resin 1 can be suppressed from being developed.

Moreover, a process for exhibiting an anchor effect with respect to sealing resin 1 is applied to surface 202, which is at another position separated by a further distance relative to the predetermined portion of projection 203 of interconnection material 2 separated by the distance from the end surface of joining material 5. This effectively prevents development of detachment of sealing resin 1.

Next, the following describes a modification of power module PM described above. It should be noted that in the modification, the same reference characters are given to the same members as those in the configuration of power module PM shown in FIG. 9 or FIG. 1, and are not repeatedly described unless required.

(Modification)

Figure 10:
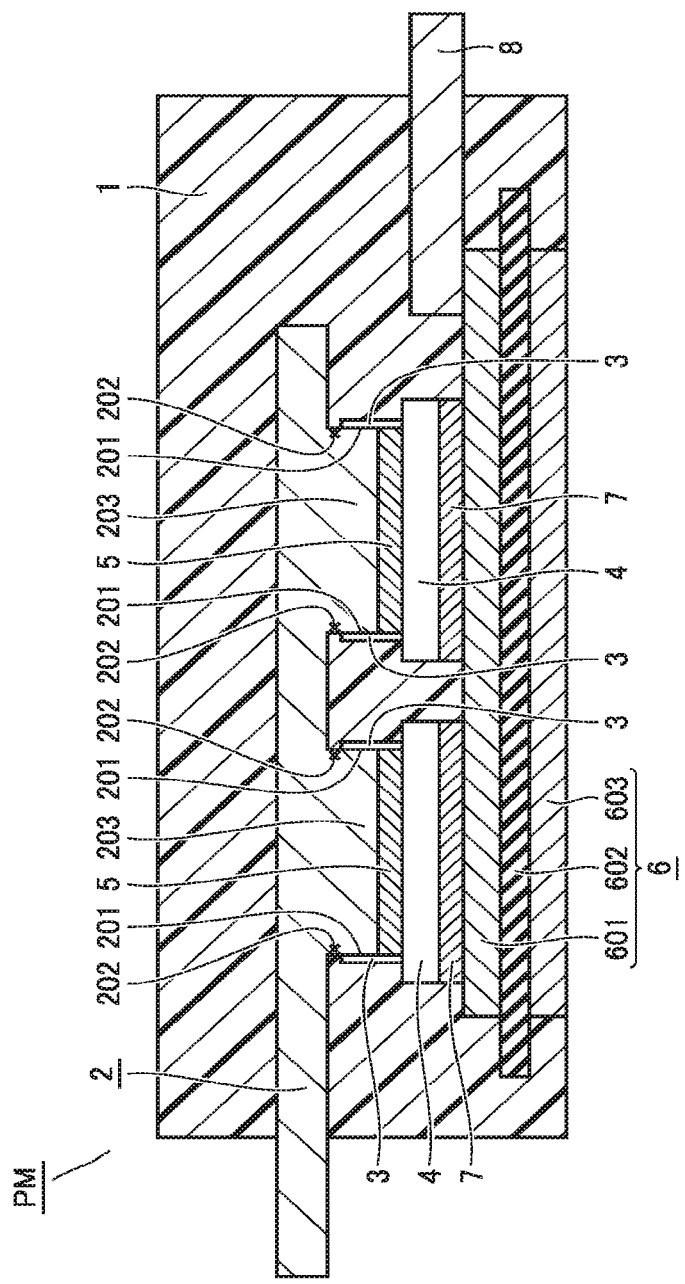
FIG. 10 is a cross sectional view of a power module according to a modification in the embodiment.

As shown in FIG. 10, as with the structure shown in FIG. 3 described above, power module PM according to the modification includes two power semiconductor elements 4, and interconnection material 2 is connected to bridge between two power semiconductor elements 4 by joining material 5.

Also in power module PM according to this modification, clearance portion 3 is formed in each of two power semiconductor elements 4. Accordingly, stress can be relaxed at the interface between sealing resin 1 and each of power semiconductor elements 4. As a result, sealing resin 1 is less likely to be detached from power semiconductor element 4, thereby suppressing development of detachment of sealing resin 1.

Fourth Embodiment

Here, the following describes a third example of the power module to which the interconnection material having the plate-like portion and the projection is applied as the interconnection material electrically connected to the power semiconductor element.

Figure 11:
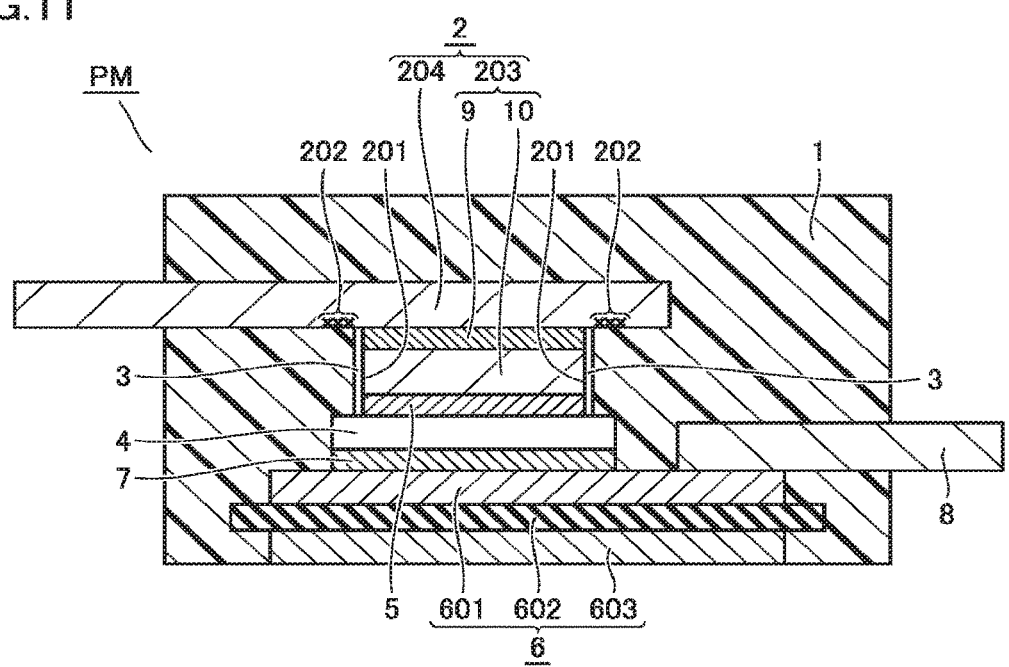
FIG. 11 is a cross sectional view of a power module according to a fourth embodiment of the present invention.

As shown in FIG. 11, in power module PM, interconnection material 2 has a plate-like conductor 204 and projection 203. Projection 203 of interconnection material 2 is electrically and mechanically connected, via joining material 5, to the electrode formed on one surface of power semiconductor element 4. Particularly, in this interconnection material 2, plate-like conductor 204 and projection 203 are separate pieces.

Projection 203 includes: a block-like conductor 10; and a joining material 9 for joining block-like conductor 10 to plate-like conductor 204. It should be noted that since a configuration other than this is the same as that of power module PM shown in FIG. 1, the same reference characters are given to the same members and are not repeatedly described unless required.

Next, the following describes an exemplary method for manufacturing power module PM having interconnection material 2 described above. First, nickel (Ni) plating is applied to at least a portion of each of the six surfaces of block-like conductor 10 in total. Since nickel is wettable by a solder, an appropriate surface of block-like conductor 10 having the nickel plating applied thereto can be soldered to plate-like conductor 204. Accordingly, block-like conductor 10 can be fixed to plate-like conductor 204 by joining material 9 composed of the solder.

Next, the surface of block-like conductor 10 opposite to its surface on which joining material 9 is disposed is electrically and mechanically connected to the electrode of power semiconductor element 4 via joining material 5. Next, interconnection material 2, power semiconductor element 4, and the like are sealed with sealing resin 1. On this occasion, since adhesion force of nickel to sealing resin 1 is weak, sealing resin 1 is intentionally detached from the side surface of block-like conductor 10 having the nickel plating applied thereto, thus obtaining clearance portion 3. In this way, power module PM is manufactured.

Also in power module PM described above, clearance portion 3 is continuously formed between sealing resin 1 and each of the end surface of joining material 5 and the surface of interconnection material 2 so as to extend from the end surface of joining material 5 to the surface of interconnection material 2, the surface of interconnection material 2 being located between the end surface and a position of projection portion 203 of interconnection material 2 separated by a distance from the end surface. Accordingly, stress is relaxed at the interface between power semiconductor element 4 and sealing resin 1, with the result that sealing resin 1 is less likely to be detached from power semiconductor element 4. Accordingly, detachment of sealing resin 1 can be suppressed from being developed.

Moreover, a process for exhibiting an anchor effect with respect to sealing resin 1 is applied to surface 202 of the plate-like portion 204 of interconnection material 2, surface 202 being separated by a further distance relative to the predetermined position of projection 203 of interconnection material 2 separated by the distance from the end surface of joining material 5. This effectively prevents development of detachment of sealing resin 1.

Next, the following describes a modification of power module PM described above. It should be noted that in the modification, the same reference characters are given to the same members as those in the configuration of power module PM shown in FIG. 11 or FIG. 1, and are not repeatedly described unless required.

(Modification)

Figure 12:
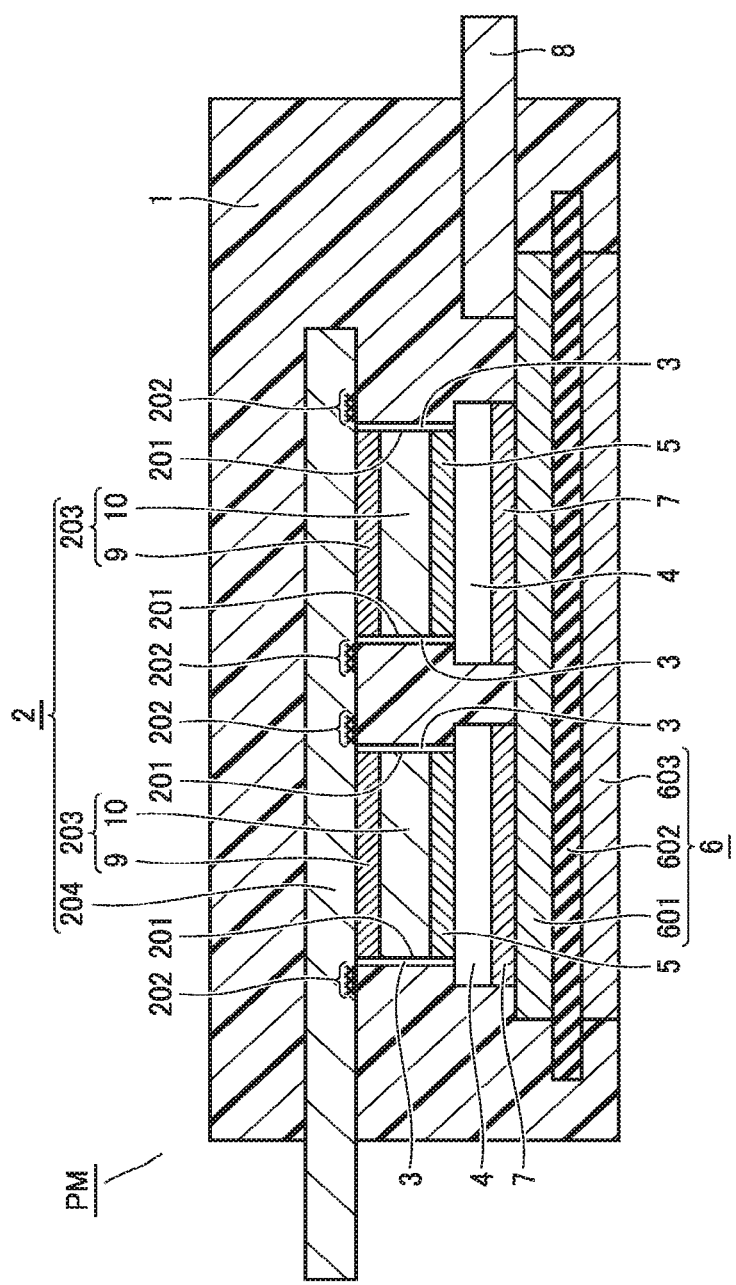
FIG. 12 is a cross sectional view of a power module according to a modification in the embodiment.

As shown in FIG. 12, as with the structure shown in FIG. 3 described above, power module PM according to the modification includes two power semiconductor elements 4, and interconnection material 2 is connected to bridge between two power semiconductor elements 4 by joining material 5.

Also in power module PM according to the modification, clearance portion 3 is formed in each of two power semiconductor elements 4. Accordingly, stress can be relaxed at the interface between sealing resin 1 and each of power semiconductor elements 4. As a result, sealing resin 1 is less likely to be detached from power semiconductor element 4, thereby suppressing development of detachment of sealing resin 1.

Fifth Embodiment

Here, the following describes a fourth example of the power module to which the interconnection material having the plate-like portion and the projection is applied as the interconnection material electrically connected to the power semiconductor element.

Figure 13:
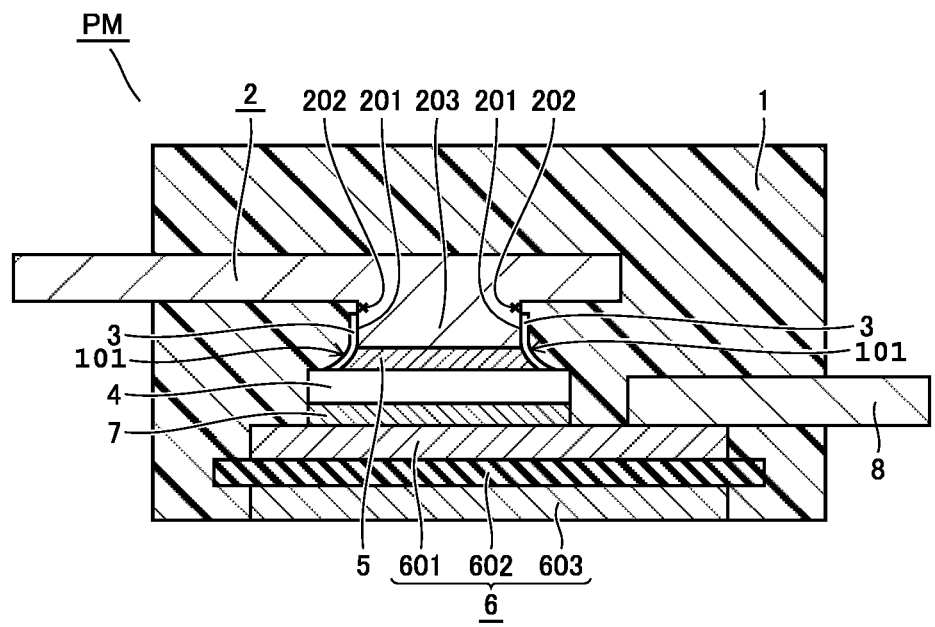
FIG. 13 is a cross sectional view of a power module according to a fifth embodiment of the present invention.

As shown in FIG. 13, in power module PM, interconnection material 2 has the plate-like portion and projection 203. Projection 203 of interconnection material 2 is electrically and mechanically connected, via joining material 5, to the electrode formed on one surface of power semiconductor element 4.

In interconnection material 2, the plate-like portion and projection 203 are formed in one piece. Particularly, the end portion (end surface) of joining material 5 for connecting projection 203 to power semiconductor element 4 exhibits a shape of fillet expanding from projection 203 to power semiconductor element 4. It should be noted that since a configuration other than this is the same as that of power module PM shown in FIG. 1, the same reference characters are given to the same members and are not repeatedly described unless required.

Figure 14:
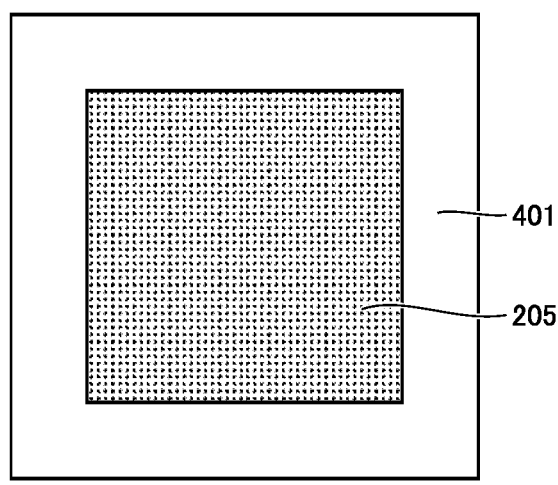
FIG. 14 is a plan view showing a positional relation between an electrode of a power semiconductor element and a position of the interconnection material wet by a solder in the embodiment.

Next, the following describes an exemplary method for manufacturing power module PM described above. First, in order for the end portion of joining material 5 to exhibit the shape of fillet, a positional relation is important between electrode 401 of power semiconductor element 4 joined to joining material 5 and position 205 of interconnection material 2 wet by joining material 5. FIG. 14 schematically shows a plan view showing the positional relation.

In order for the end portion of joining material 5 to exhibit the shape of fillet, first, the area of position 205 of interconnection material 2 wet by joining material 5 needs to be smaller than the area of electrode 401. Next, a region of wet position 205 needs to be located in the region of electrode 401. FIG. 14 shows an exemplary positional relation, which satisfies such two conditions, between electrode 401 and wet position 205.

In the positional relation satisfying these conditions, the end portion (end surface) of joining material 5 can have the shape of fillet by using, as joining material 5, a material temporarily in liquid state during the process. Examples of such material include a solder. After forming the end portion of joining material 5 into the shape of fillet, interconnection material 2, power semiconductor element 4, and the like are sealed with sealing resin 1, thereby manufacturing power module PM.

Since the end portion of joining material 5 exhibits the shape of fillet in power module PM, sealing resin 1 located at this portion has a round shape 101 reflecting the shape of fillet. The portion of sealing resin 1 with round shape 101 is located near a position at which sealing resin 1 is adhered to power semiconductor element 4.

This provides a more increased stress relaxation effect at the interface between power semiconductor element 4 and sealing resin 1, thereby suppressing further development of detachment of sealing resin 1 from clearance portion 3 toward the interface between power semiconductor element 4 and sealing resin 1.

It should be noted that the power modules described in the above embodiments can be combined variously as required.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The present invention is used effectively for a power module in which a power semiconductor element and the like are sealed with a sealing resin.

REFERENCE SIGNS LIST

PM: power module; 1: sealing resin; 101: round shape; 2: interconnection material; 201, 202: surface; 203: projection; 204: plate-like conductor; 205: wet position; 3: clearance portion; 4: power semiconductor element; 401: electrode; 5: joining material; 6: circuit board; 601: metal plate; 602: insulating substrate; 603: metal plate; 7: joining material; 8: external terminal; 9: joining material; 10: block-like conductor.

The invention claimed is:

1. A power module comprising:
a power semiconductor element having a first surface and a second surface facing each other, a first electrode being formed on the first surface, a second electrode being formed on the second surface;
an interconnection material disposed to face the first surface of the power semiconductor element;
a joining material formed between the first electrode and the interconnection material to electrically and mechanically connect the first electrode to the interconnection material;
a circuit board disposed to face the second surface of the power semiconductor element and electrically and mechanically connected to the second electrode; and
a sealing resin for sealing the power semiconductor element, the interconnection material, the joining material, and the circuit board,
a clearance portion being provided between the sealing resin and each of an end surface of the joining material and a surface of the interconnection material and extending from the end surface of the joining material to the surface of the interconnection material, the end surface of the joining material being located between the power semiconductor element and the interconnection material, the surface of the interconnection material being located between the end surface and a position of the interconnection material separated by a distance from the end surface, wherein
the joining material is such that an adhesion force between the joining material and the sealing resin is the weakest among adhesion forces in the group consisting of an adhesion force between the interconnection material and the sealing resin, an adhesion force between the power semiconductor element and the sealing resin, an adhesion force between a metal plate of the circuit board connected to the second electrode and the sealing resin, and the adhesion force between the joining material and the sealing resin, wherein
the sealing resin is preferentially detached from an interface between the joining material and the sealing resin due to thermal stress when a temperature of the power module decreases.

2. The power module according to claim 1, wherein
at least one selected from the group consisting of a plating film, a parting agent, and a solder, is formed on a portion of the surface of the interconnection material at the clearance portion.

3. The power module according to claim 2, wherein
the plating film is Ni plating.

4. The power module according to claim 2, wherein
the solder is a lead-free solder including Sn.

5. The power module according to claim 1, wherein
a portion of the surface of the interconnection material at the clearance portion is a smooth surface.

6. The power module according to claim 1, further comprising an adhesion portion at which the sealing resin is adhered to the interconnection material, the adhesion portion being provided on a portion of the surface of the interconnection material at another position separated by a further distance, relative to the position of the interconnection material, from the end surface of the joining material.

7. The power module according to claim 6, wherein
at least one selected from the group consisting of a dimple, an opening, and a through hole, is formed at the portion of the surface of the interconnection material at the adhesion portion.

8. The power module according to claim 6, wherein
the portion of the surface of the interconnection material at the adhesion portion is a rough surface.

9. The power module according to claim 1, wherein
the interconnection material is in a form of a flat plate.

10. The power module according to claim 1, wherein
the interconnection material includes a plate-like portion and a projection,
the projection is connected to the first electrode via the joining material, and
the clearance portion includes a side surface of the projection.

11. The power module according to claim 10, wherein
the projection is formed such that the plate-like portion is projected.

12. The power module according to claim 10, wherein
the projection is solid.

13. The power module according to claim 10, wherein
the projection and the plate-like portion are formed in one piece.

14. The power module according to claim 10, wherein
the projection and the plate-like portion are separate pieces, and
the projection is joined to the plate-like portion.

15. The power module according to claim 14, wherein nickel plating is provided on at least a portion of a surface of the projection.

16. The power module according to claim 10, wherein the end surface of the joining material exhibits a shape of fillet to expand from the interconnection material to the first electrode.

17. The power module according to claim 1, wherein the joining material is composed of a solder, and the sealing resin is composed of an epoxy resin.

* * * * *